(12) United States Patent
Horii

(10) Patent No.: US 7,400,008 B2
(45) Date of Patent: Jul. 15, 2008

(54) SEMICONDUCTOR DEVICE AND MANUFACTURING PROCESS THEREFOR

(75) Inventor: Hideaki Horii, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 84 days.

(21) Appl. No.: 11/068,965

(22) Filed: Mar. 2, 2005

(65) Prior Publication Data

US 2005/0196916 A1 Sep. 8, 2005

(30) Foreign Application Priority Data

Mar. 3, 2004 (JP) ............................ P2004-059420

(51) Int. Cl.
*H01L 29/00* (2006.01)
(52) U.S. Cl. ................ 257/309; 257/534; 257/E23.144; 438/398
(58) Field of Classification Search .................. 29/852, 29/352; 361/305; 257/309, 534, E27.048, 257/E23.144; 438/398
See application file for complete search history.

(56) References Cited

U.S. PATENT DOCUMENTS 6,222,722 B1 *  4/2001  Fukuzumi et al. ............ 361/305
6,757,971 B2 *  7/2004  Sinha .......................... 29/852

FOREIGN PATENT DOCUMENTS

JP  H011-274428 A  10/1999
JP  2003-347416 A  12/2003

* cited by examiner

*Primary Examiner*—Minh-Loan T Tran
(74) *Attorney, Agent, or Firm*—Sughrue Mion, PLLC

(57) ABSTRACT

An objective of this invention is to provide a semiconductor device comprising a less bias-dependent capacitative element with a large capacity per a unit area, having a configuration which can be manufactured using an existing structure in a semiconductor device. There is provided a semiconductor device 100, comprising a semiconductor substrate; a lower interconnection 101 on the semiconductor substrate, in whose upper surface a concave is formed; dielectrics 102a, 102b, 102c, 102d covering the inner surface of the concave; and a upper interconnection 104 on the dielectrics 102a, 102b, 102c, 102d.

16 Claims, 19 Drawing Sheets

PRIOR ART

PRIOR ART

US 7,400,008 B2

SEMICONDUCTOR DEVICE AND MANUFACTURING PROCESS THEREFOR

This application is based on Japanese patent application NO. 2004-059420, the content of which is incorporated hereinto by reference.

BACKGROUND OF THE INVENTION

1. Field of the Invention

This invention relates to a semiconductor device and a manufacturing process therefor.

2. Description of the Related Art

There have been recently intense efforts for investigating a semiconductor device comprising a capacitative element for preventing circuit oscillation or noise in a semiconductor LSI.

There are several methods for forming such a capacitative element structure in an LSI. Generally, a gate oxide film in a transistor (Tr) is often used as a dielectric for a capacitative element without its dedicated structure. As an example of such a technique, FIG. 2 shows a semiconductor device comprising a capacitative element having a conventional and common configuration.

In this semiconductor device 200, a capacitative element is formed using a gate oxide film 210 as a dielectric and a well 208 and a gate electrode 211 formed in a silicon substrate 207 as electrodes for the capacitative element. The capacitative element is separated from other elements by $SiO_2$ regions 209a, 209b and 209c. The capacitative element and other elements are interconnected via contact plugs 212a, 212b and interconnections 206a, 206b.

In this prior art, the semiconductor device 200 utilizes an existing common structure, so that increase of the number of manufacturing steps can be limited. Furthermore, a thin gate oxide film 210 is used as a dielectric, forming a capacitative element with a high capacity and a smaller area.

Alternatively, a structure dedicated to a capacitative element is sometimes used. As an exemple of such a technique, FIG. 3 shows a semiconductor device comprising a capacitative element having a conventional and common configuration.

In this semiconductor device 300, a capacitative element is formed by sequentially depositing a gate electrode 211 made of a metal material, a dielectric 213 (usually, a $SiO_2$ or SiN film by CVD) and a an upper electrode for capacity 214 made of a metal material on an $SiO_2$ region 209b formed on a silicon substrate 207. The capacitative element and other elements are interconnected via contact plugs 212a, 212b and interconnections 206a, 206b.

In this prior art, the electrodes in the capacitative element are the gate electrode 211 and the upper electrode for capacity 214, both of which are made of a metal material, so that a capacitative element with less bias dependency can be formed.

Alternatively, a capacitative element can be formed using an interlayer insulating film as a dielectric and a metal interconnection as an electrode. As an exemple of such a technique, FIGS. 4A and 4B show a semiconductor device comprising a capacitative element having a conventional and common configuration.

A semiconductor device 400 shown in FIG. 4A is an example where a lower interconnection 201, an upper interconnection 204 and an interlayer insulating film 205 are used as capacitative elements. A semiconductor device 500 shown in FIG. 4B is an example using interconnections 206a, 206b and an interlayer insulating film 205 in the same layer as capacitative elements.

Both semiconductor devices 400, 500 shown in FIGS. 4A and 4B utilize an existing metal interconnection structure as it is, resulting in limitation in increase of the number of manufacturing steps in this prior art.

Additionally, Japanese Patent Application NO. 1999-274428 describes a technique for a semiconductor device with a capacitative element. FIG. 19 shows a semiconductor device similar to that in the reference. The semiconductor device comprises a lower electrode 413 on a silicon substrate 401. There is formed a silicon oxide film 402 between the silicon substrate 401 and the lower electrode 413. The lower electrode 413 has a structure where a titanium silicide film 412 is deposited on a polysilicon film 411.

On the lower electrode 413, there is formed an upper electrode 415. A dielectric film 406 is formed between the lower electrode 413 and the upper electrode 415, to provide a capacitative element. The capacitative element is surrounded by a first interlayer insulating film 404. The capacitative element and other elements are interconnected via aluminum interconnections 408a, 408b and a buried plug 409.

Japanese Patent Application NO. 1999-274428 describes that this prior art can provide a convenient process for manufacturing a semiconductor device to realize an improved yield and a reduced cost.

Japanese Patent Application NO. 2003-347416 discloses another technique for a semiconductor device comprising a capacitative element. FIGS. 18A and 18B show a semiconductor device similar to that described in the reference.

FIG. 18B is a cross-sectional view of this semiconductor device, which corresponds to a cross-sectional view taken on line A-A' of FIG. 18A described below. The semiconductor device comprises a first interlayer insulating film, on which are formed lower interconnection metals 31, 37, on which an upper interconnection metal 3105 is deposited. There is formed a second interlayer insulating film 311 between the lower interconnection metals 31, 37 and the upper interconnection metal 3105.

The second interlayer insulating film 311 comprises a plurality of Ti-containing barrier metal/tungsten films 3104 connecting the lower interconnection metal 37 to the upper interconnection metal 3105. The bottoms and the sides of the Ti-containing barrier metal/tungsten films 3104 are surrounded by an insulating film for a capacitative element 3102. A capacitative element unit 3100 is constituted by the interconnection metal 37 and a Ti-containing barrier metal/tungsten film 3104 as electrodes and the insulating film for a capacitative element 3102 as a dielectric film.

The lower interconnection metal 31 and the upper interconnection metal 3105 are interconnected via an interconnection-connecting contact 3103.

FIG. 18A shows a side and a plan views of the upper interconnection metal 3105 in this semiconductor device. The bottom of the upper interconnection metal 3105 comprises a plurality of capacitative elements 3200 consisting of a Ti-containing barrier metal/tungsten film 3104 and the insulating film for a capacitative element 3102 to constitute the capacitative element unit 3100.

Japanese Patent Application NO. 2003-347416 describes that according to this prior art, a plurality of capacitative elements can be appropriately selected to adjust a capacity of a capacitative element.

The above prior art leaves room for improvement as described below.

First, the semiconductor device shown in FIG. 2 utilizes the well 208 formed in the silicon substrate 207 as an electrode. Thus, an applied voltage may generate a depletion layer in the well 208 and variation of a thickness of the depletion layer causes capacity variation, i.e., bias dependency. A designer must, therefore, design a circuit, taking such bias dependency into account.

Furthermore, the well 208 formed in the silicon substrate 207 and the gate electrode 211 are used as electrodes for a capacitive element, so that the capacitive element occupies a large area on a chip. Thus, a transistor (Tr) may not be formed in the area which is occupied by the capacitative element, leading to a larger chip area.

Second, the semiconductor device shown in FIG. 3 has a structure dedicated to a capacitative element. It may lead to increase of the number of manufacturing steps and thus an increased product cost in comparison with a device without such a dedicated structure.

In the structure shown in FIG. 4, the interlayer insulating film between metal interconnections used as a dielectric film is thicker than that in the other prior arts described above. It results in a capacity per a unit area of the dielectric film is lower and a larger area is, therefore, needed for giving a required capacity. Thus, it may lead to an increased chip size and an increased product cost.

Since a structure dedicated to a capacitative element is formed in the structure shown in FIG. 19, the number of manufacturing steps and a product cost may be increased in comparison with a device without such a dedicated structure.

In this configuration, the dielectric film 406 formed in the bottom of the upper electrode 415 can function as a component in a capacitative element, while the dielectric film 406 formed in the side of the upper electrode 415 cannot fully function as a component in a capacitative element. Thus, it may result in an inadequate capacity per a unit area of the capacitative element.

Since the structure shown in FIG. 18 also has a structure dedicated to a capacitative element, the number of manufacturing steps and a product cost may be increased in comparison with a device without such a dedicated structure.

The insulating film capacitative element 3102 formed in the bottom of the Ti-component barrier metal/tungsten film 3104 can function as a component in a capacitative element, while the insulating film for a capacitative element 3102 formed in the side of the Ti-component barrier metal/tungsten film 3104 cannot fully function as a component in a capacitative element. Thus, it may result in an inadequate capacity per a unit area of the capacitative element.

SUMMARY OF THE INVENTION

According to an aspect of this invention, there is provided a semiconductor device, comprising
a semiconductor substrate;
a first metal film on the semiconductor substrate, in whose upper surface a concave is formed;
a capacitor film covering the inner surface of the concave; and
a second metal film on the capacitor film.

According to another aspect of this invention, there is provided a capacitor comprising:
a first metal wiring having a plurality of concaves thereon;
a plurality of dielectric films each formed on surfaces of said first metal in the respective concaves;
an interlayer insulating film having a plurality of holes therethrough each provided to relate to one of said concaves;
a plurality of plugs each formed in the corresponding ones of said plurality of concaves and said plurality of holes;
and a second metal wiring formed on said interlayer and said plurality of plugs.

In this configuration, the structure consisting of the first and the second metal films is used as electrodes in a capacitative element so that a semiconductor device comprising a less bias-dependent capacitative element can be provided.

In this configuration, there is formed a capacitor film covering the inner surface of the first metal for a capacitative element, resulting in a semiconductor device comprising a capacitative element with a larger capacity per a unit area in comparison with a capacitative element having a planar structure.

In this configuration, a usual structure in a common semiconductor device can be used as an electrode for a capacitative element. Thus, a capacitative element can be conveniently produced by a common manufacturing process for a semiconductor device, resulting in a lower production cost for a semiconductor device comprising a capacitative element.

According to another aspect of this invention, there is provided a process for manufacturing a semiconductor device, comprising the steps of:
forming a first metal film on the upper surface of a semiconductor substrate;
forming an upper insulating film on the first metal film;
forming a through hole penetrating the insulating film, whose tip is a concave in the upper surface of the fist metal film;
forming a capacitor film covering the inner surface of the concave in the first metal film; and
forming a second metal film on the capacitor film.

According to this process, the structure consisting of the first and the second metal films is used as electrodes in a capacitative element so that a semiconductor device with a less bias-dependent capacitative element can be provided.

According to this process, the capacitor film covering the concave in the first metal film is formed for a capacitative element so that a semiconductor device having a larger capacity per a unit area can be provided in comparison with a capacitative element having a planar structure.

According to this invention, a usual structure in a common semiconductor device can be used as an electrode for a capacitative element. Thus, a capacitative element can be conveniently produced by a common manufacturing process for a semiconductor device, resulting in a lower production cost for a semiconductor device comprising a capacitative element.

Although the components of this invention have been described, any appropriate combination of these components may be effective as an aspect of this invention.

For example, in a capacitative element in a semiconductor device according to this invention, a first metal film can be formed in, but not limited to, the top layer in order to stabilize a current in the semiconductor device having a multilayer interconnection structure. A capacitative element may be formed in any layer, e.g., a first or second layer.

This invention can provide a semiconductor device comprising a less bias-dependent capacitative element with a large capacity per a unit area, from a configuration which can be produced using a structure in a common semiconductor device because a structure consisting of a first and a second metal films is used as electrodes in a capacitative element and a capacitor film covering the inner surface of a concave in the first metal film for a capacitative element.

BRIEF DESCRIPTION OF THE DRAWINGS

The above and other objects, advantages and features of the present invention will be more apparent from the following description taken in conjunction with the accompanying drawings, in which.

Figure 1:
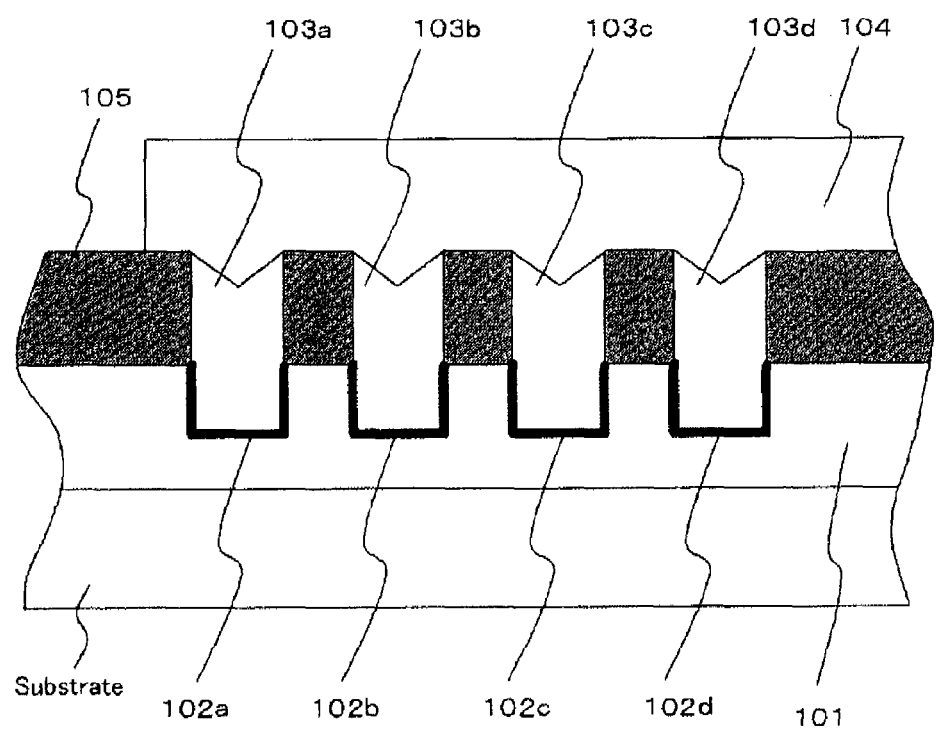
FIG. 1 is a schematic cross-sectional view showing a semiconductor device comprising a capacitative element according to an embodiment.
Figure 2:
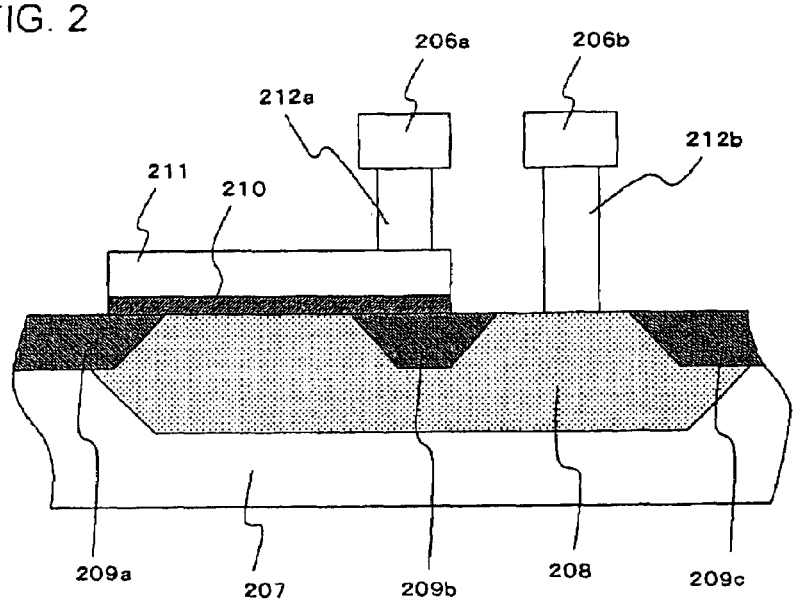
FIG. 2 is a schematic cross-sectional view showing an example of a semiconductor device comprising a capacitative element according to the prior art.
Figure 3:
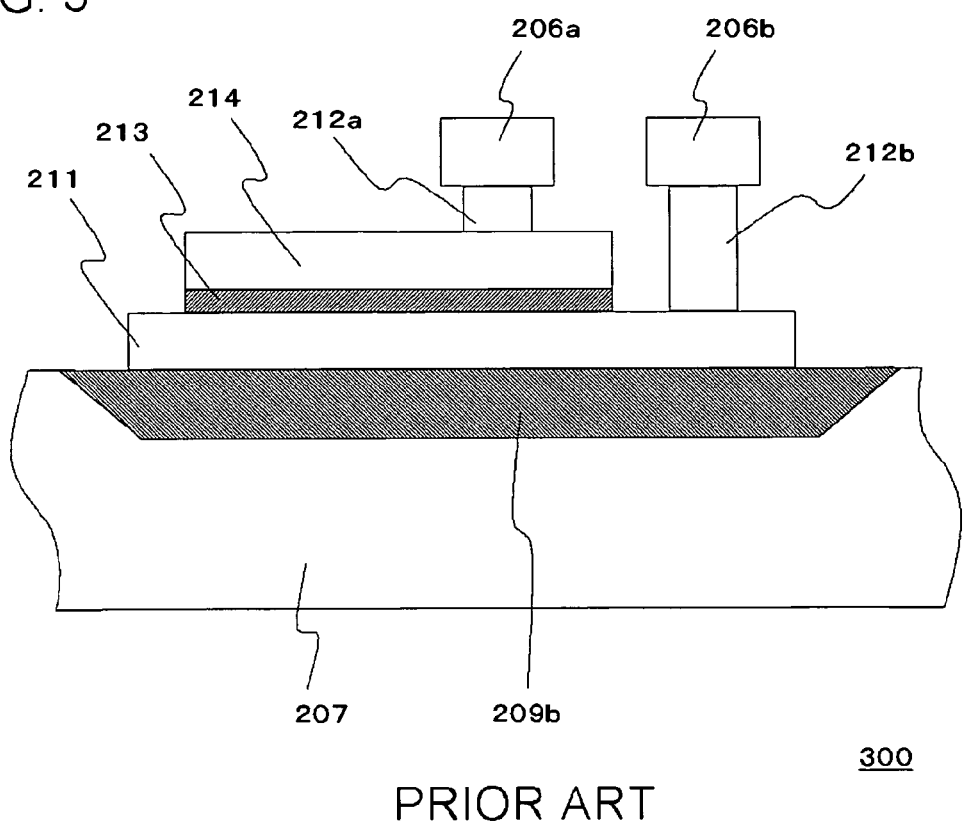
FIG. 3 is a schematic cross-sectional view showing an example of a semiconductor device comprising a capacitative element according to the prior art.
Figure 4A:
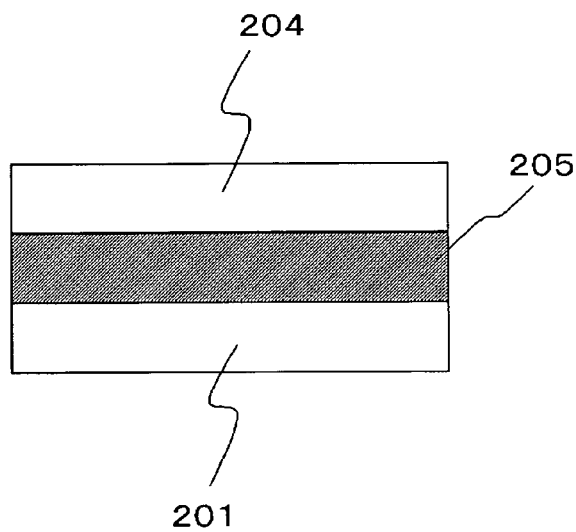
FIGS. 4A and 4B are schematic cross-sectional views showing an example of a semiconductor device comprising a capacitative element according to the prior art, respectively.
Figure 4B:
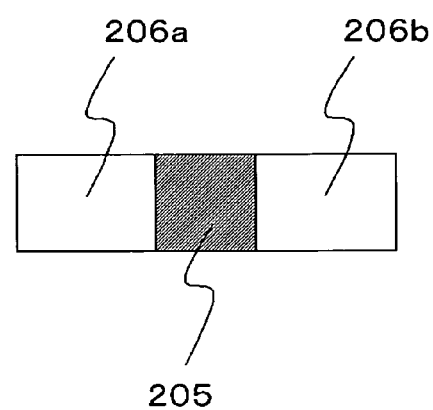

In the drawings, the symbols have the following meanings; 31: a lower interconnection metal, 37: a lower interconnection metal, 311: a second interlayer insulating film, 100: a capacitative element, 101: an interconnection, 102: a dielectric, 103: a metal plug, 104: an interconnection, 105: an interlayer insulating film, 106: a resist film, 120: a resist film, 122: a dielectric, 200: a capacitative element, 201: an interconnection, 204: an interconnection, 205: an interlayer insulating film, 206: an interconnection, 207: a silicon substrate, 208: a well, 209: an $SiO_2$ region, 210: a gate oxide film, 211: a gate electrode, 212: a contact plug, 213: a dielectric, 214: an upper electrode for capacity, 300: a capacitative element, 400: a semiconductor device, 401: a silicon substrate, 402: a siliconoxide film, 404: a first interlayer insulating film, 406: a dielectric film, 408: an aluminum interconnection, 409: a buried plug, 411: a polysilicon film, 412: a titanium silicide film, 413: a lower electrode, 415: an upper electrode, 500: a capacitative element, 3100: a capacitative element unit, 3102: an insulating film for a capacitative element, 3103: an interconnection-connecting contact, 3104: a Ti-containing barrier metal/tungsten film, 3105: an upper interconnection metal, and 3200: a capacitative element.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

In this invention, the first metal film is a metal interconnection while the second metal film may be a metal plug.

In this configuration, a usual structure consisting of a metal interconnection and a metal plug in a common semiconductor device can be used as an electrode for a capacitative element. Thus, a capacitative element can be conveniently produced by a common manufacturing process for a semiconductor device, resulting in a lower production cost for a semiconductor device comprising a capacitative element.

In this invention, a plurality of concaves may be formed in the first metal film and a second metal film may be formed on a capacitor film covering the inside of each of the plurality of concaves.

According to this configuration, by forming a plurality of capacitative element on the upper surface of a single first metal film, a group of capacitative elements having a large capacity in total can be formed in a small area, resulting in size reduction of a semiconductor device comprising a capacitative element.

Furthermore, the semiconductor device may further comprise a third metal film connected to the plurality of second metal films.

According to this configuration, a plurality of capacitative elements connected to a single first metal film and a single second metal film can be formed and a group of capacitative elements having a large capacity in total in a small area can be used like a single capacitative element, resulting in increased freedom of designing a semiconductor device comprising a capacitative element.

The third metal film may be a metal interconnection.

In this configuration, a usual metal interconnection in a common semiconductor device can be used as an interconnection connected to a capacitative element. Thus, a capacitative element can be conveniently produced by a common manufacturing process for a semiconductor device, resulting in a further lower production cost for a semiconductor device comprising a capacitative element.

The capacitor film may comprise a metal oxide film, a metal nitride film and a metal oxynitride film.

According to this configuration, there can be provided a highly insulative capacitor film with a higher dielectric constant, which can provide a semiconductor device comprising a reliable capacitative element with a large capacity per a unit area.

The first metal film may comprise an Al- or Cu-containing metal film. The capacitor film may comprise an Al- or Cu-containing dielectric film such as an Al- or Cu oxide, nitride or oxynitride film.

According to this configuration, there can be provided a highly conductive first metal film and a highly insulative capacitor film with a higher dielectric constant, which can provide a semiconductor device comprising a reliable capacitative element with a large capacity per a unit area.

The capacitor film may comprise a film formed by oxidation or nitriding the inner surface of the concave in the first metal film.

According to this configuration, there can be conveniently provided a highly insulative capacitor film with a higher dielectric constant, which can consistently provide a semiconductor device comprising a reliable capacitative element with a large capacity per a unit area.

The capacitor film may comprise a silicon oxide film, a silicon nitride film or a silicon oxynitride film.

According to this configuration, there is provided a highly insulative capacitor film with a higher dielectric constant, which can provide a semiconductor device comprising a reliable capacitative element with a large capacity per a unit area.

The capacitor film may comprise a film deposited on the inner surface of the concave in the first metal film by CVD or PVD.

According to this configuration, there can be conveniently provided a highly insulative capacitor film with a higher dielectric constant, which can consistently provide a semiconductor device comprising a reliable capacitative element with a large capacity per a unit area.

There will be described embodiments of this invention with reference to the drawings. Throughout the drawings, similar components have similar symbols, whose description is omitted as appropriate.

Embodiment 1

FIG. 1 is a cross-sectional view schematically showing a semiconductor device comprising a capacitative element according to this embodiment.

A semiconductor device 100 according to this embodiment comprises a lower interconnection 101 and an upper interconnection 104 made of a metal such as aluminum and copper. There is an interlayer insulating film 105 such as an $SiO_2$ film between the lower interconnection 101 and the upper interconnection 104.

In the upper surface of the lower interconnection 101, a plurality of concaves are formed. The inner surface of each concave comprises dielectrics 102a, 102b, 102c, 102d such as an aluminum oxide film and a copper oxide film.

On the dielectrics 102a, 102b, 102c, 102d, there are formed metal plugs 103a, 103b, 103c, 103d, respectively, such as an aluminum plug and a copper plug, whose opposite ends are connected to the upper interconnection 104.

The semiconductor device 100 according to this embodiment comprises a plurality of capacitative elements. Each of these capacitative elements comprises the lower interconnection 101 and the metal plug 103a, 103b, 103c or 103d as its electrodes and uses the dielectric 102a, 102b, 102c or 102d, respectively, as a capacitor film.

The semiconductor device 100 employs the structure consisting of the lower interconnection 101 and the metal plug 103a, 103b, 103c or 103d as electrodes in a capacitative element, so that it is less bias-dependent.

Furthermore, in the semiconductor device 100, the dielectrics 102a, 102b, 102c, 102d covering the inner surfaces of the concaves in the lower interconnection 101 for a capacitative element are formed as a capacitor film. Thus, the dielectrics 102a, 102b, 102c, 102d as a capacitor film have a larger area than those in a capacitative element having a planar structure. Therefore, the semiconductor device 100 comprises a capacitative element with a large capacity per a unit area.

The semiconductor device 100 employs the lower interconnection 101 which is a usual metal interconnection in a common semiconductor device, as one electrode in a capacitative element, while employing the metal plugs 103a, 103b, 103c and 103d which are usual metal plugs in a common semiconductor device, as the other electrode in the capacitative element. Thus, a capacitative element can be conveniently produced by a process for manufacturing a common semiconductor device, resulting in a lower production cost for a semiconductor device 100 comprising a capacitative element.

In the semiconductor device 100, a plurality of capacitative elements can be formed on the upper surface of the lower interconnection 101 to form a group of capacitative elements having a large capacity in total in a small area. Therefore, the size of the semiconductor device 100 comprising a capacitative element can be reduced.

In the semiconductor device 100, a plurality of capacitative elements connected to the lower interconnection 101 and the upper interconnection 104 can be formed so that a group of capacitative elements having a large capacity in total in a small area can be used like a single capacitative element, resulting in increased freedom of designing the semiconductor device 100 comprising a capacitative element.

The lower interconnections 101, metal plug 103a, 103b, 103c, 103d, and the upper interconnection 104 may be a metal film made of any appropriate conductive metal, an Al- or Cu-containing metal, or an alloy of these metals. An Al- or Cu-containing metal film may be suitably used because of its good conductivity.

A film thickness of the lower interconnection 101 is about 100 nm to 1000 nm while a film thickness of the upper interconnection 104 is about 100 nm to 1000 nm. A diameter of the metal plug 103a, 103b, 103c or 103d is about 100 nm to 1000 nm.

The dielectrics 102a, 102b, 102c and 102d may comprise a film made of an appropriate material as long as it is an insulating film with a higher dielectric constant; for example, an Al- or Cu oxide film, a nitride film or an oxynitride film. These dielectrics can function as a highly insulative capacitor film with a higher dielectric constant, to provide a semiconductor device 100 comprising a reliable capacitative element with a large capacity per a unit area.

A film thickness of the dielectric 102a, 102b, 102c or 102d is about 10 nm to 100 nm. A depth of the concave in the upper surface of the lower interconnection 101 where the dielectric 102a, 102b, 102c or 102d is formed is about 5 nm to 990 nm.

The interlayer insulating film 105 may be a film made of any appropriate insulative material; for example, a silicon oxide film, a silicon nitride film and a silicon oxynitride film. Since these films are highly insulative, short circuit can be effectively prevented between the lower interconnection 101 and the upper interconnection 104, resulting in a semiconductor device 100 comprising a reliable capacitative element.

A thickness of the interlayer insulating film 105 is about 100 nm to 1000 nm.

The number of the metal plugs (103a, 103b, 103c, 103d) for the lower interconnection 101 is not limited to four, but any appropriate number may be acceptable. The more the number of the metal plugs 103 is, the more a total charge which can be stored in the group of a plurality of capacitative elements in which one electrode is the lower interconnection 101 in the semiconductor device 100 is.

Thus, a capacitative element directly connected to the lower interconnection 101 and the upper interconnection 104 is provided, so that for example, fluctuation in a current flowing the lower interconnection 101 and the upper interconnection 104 can be reduced to provide a semiconductor device 100 with good current stability.

Embodiment 2

FIGS. 5 to 10 are process sectional views showing a process for manufacturing a semiconductor device comprising a capacitative element according to this embodiment.

Figure 5:
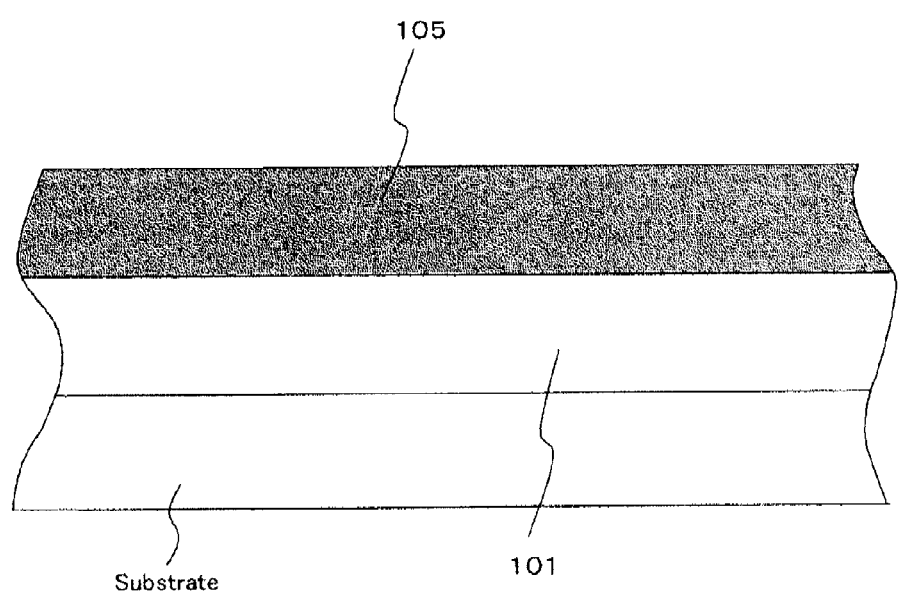
FIG. 5 is a process sectional view showing a process for manufacturing a semiconductor device comprising a capacitative element according to an embodiment.

For manufacturing the semiconductor device 100 according to Embodiment 2, an interlayer insulating film 105 is first formed on the lower interconnection 101 as shown in FIG. 5. The procedure before forming the interlayer insulating film 105 is as in a manufacturing process for a common semiconductor device.

Figure 6:
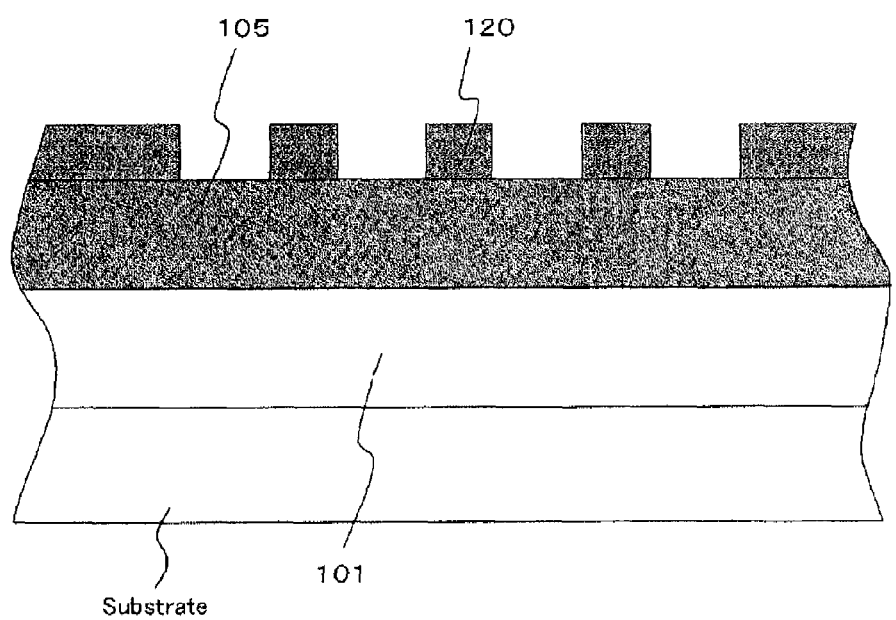
FIG. 6 is a process sectional view showing a process for manufacturing a semiconductor device comprising a capacitative element according to an embodiment.

Then, after forming the interlayer insulating film 105, a resist pattern of a resist film 120 is formed for forming a metal plug hole for the capacitative element of this embodiment, as shown in FIG. 6.

Figure 7:
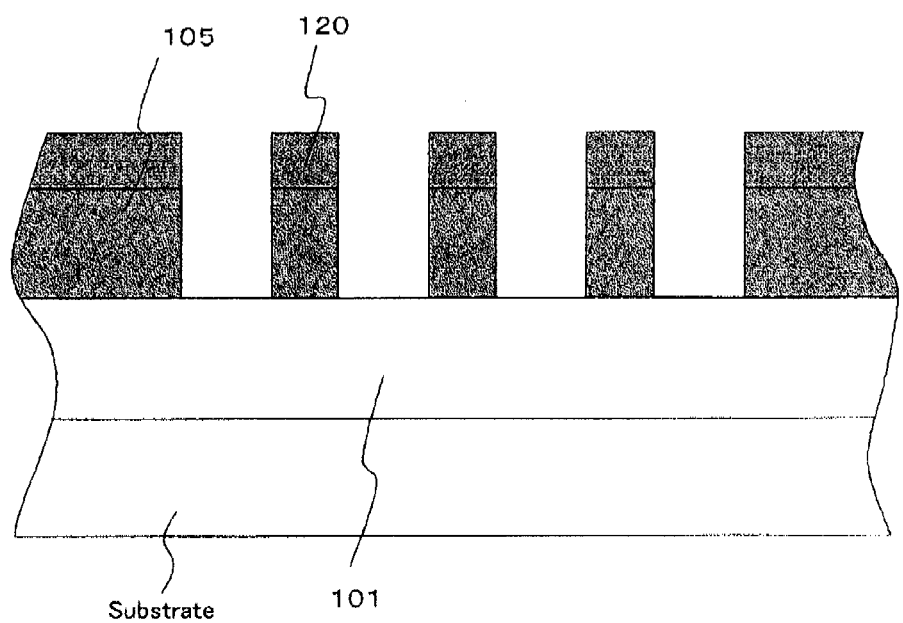
FIG. 7 is a process sectional view showing a process for manufacturing a semiconductor device comprising a capacitative element according to an embodiment.

Then, as shown in FIG. 7, the interlayer insulating film 105 is etched using the resist pattern of the resist film 120 as a mask. During the step, an etching gas may be an etching gas generally used in a via forming step in a common process for manufacturing a semiconductor device.

Figure 8:
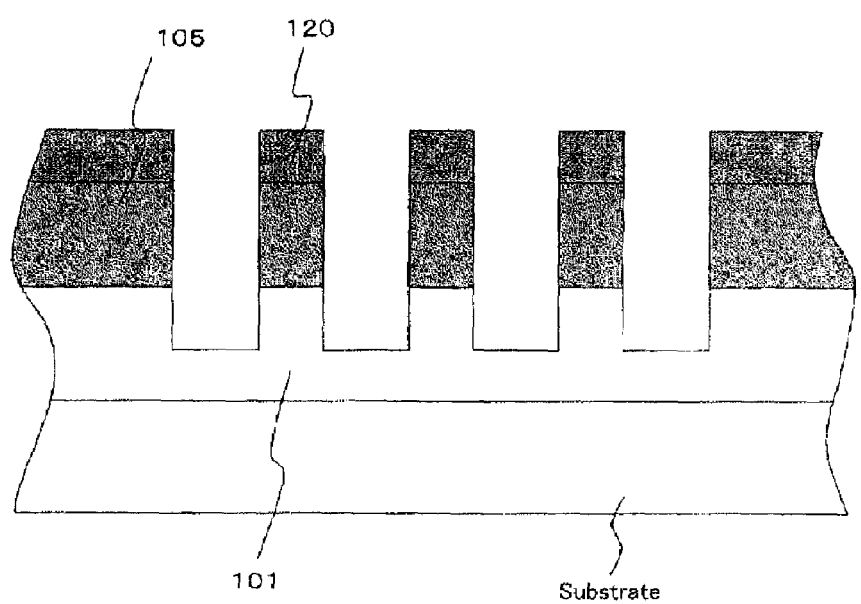
FIG. 8 is a process sectional view showing a process for manufacturing a semiconductor device comprising a capacitative element according to an embodiment.

Next, as shown in FIG. 8, a lower interconnection 101, a metal interconnection, is etched to form a concave pattern in the metal interconnection. During the step, a halogen-containing etching gas may be used when the lower interconnection 101 is made of aluminum.

Figure 9:
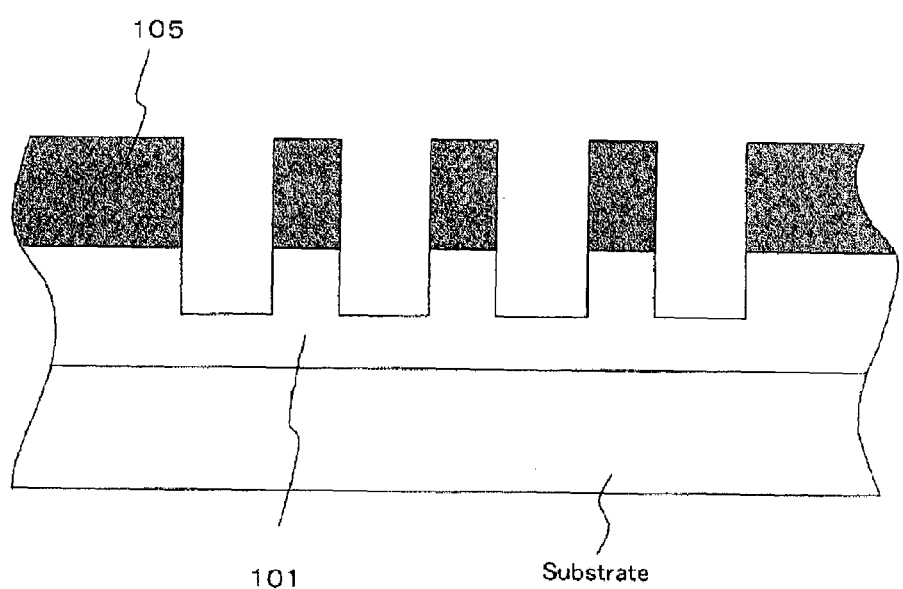
FIG. 9 is a process sectional view showing a process for manufacturing a semiconductor device comprising a capacitative element according to an embodiment.

Then, as shown in FIG. 9, the resist film 120 is removed as usual.

Figure 10:
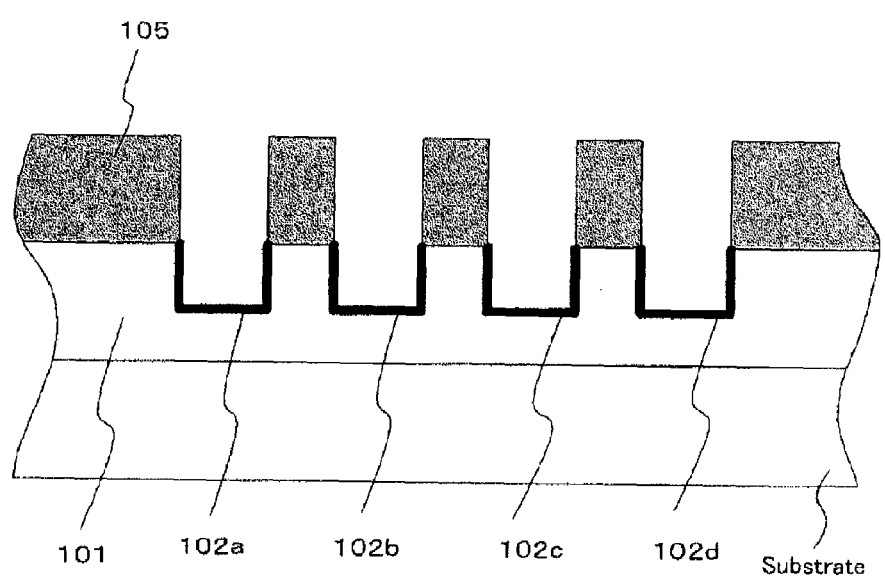
FIG. 10 is a process sectional view showing a process for manufacturing a semiconductor device comprising a capacitative element according to an embodiment.

Then, as shown in FIG. 10, the exposed part (concave) of the lower interconnection 101 is oxidized or nitrided to form dielectrics 102a, 102b, 102c and 102d.

In this process, when the lower interconnection 101 is made of aluminum, the lower interconnection 101 can be oxidized with a gas containing $O_2$ plasma to form the dielectrics 102a, 102b, 102c, 102d as aluminum oxide films. Alternatively, the lower interconnection 101 can be nitrided with a gas containing $N_2$ plasma to form the dielectric 102a, 102b, 102c and 102d as aluminum nitride films.

Then, following a manufacturing step for a usual metal plug in a common semiconductor device, metal plugs 103a, 103b, 103c and 103d are formed. When the metal plugs 103a, 103b, 103c and 103d are made of aluminum or copper, they can be formed by CVD, a plasma process or plating.

Following a manufacturing step for a usual metal interconnection in a common semiconductor device, an upper interconnection 104 is formed. When the upper interconnection 104 is an aluminum or copper plug, it can be formed by CVD, a plasma process or plating.

The above process can provide the semiconductor device 100 according to Embodiment 1 shown in FIG. 1.

According to the process for manufacturing a semiconductor device of this embodiment, the structure consisting of the lower interconnection 101 and the upper interconnection 104 is used as electrodes in a capacitative element. Thus, the electrodes can be made of a less bias-dependent metal material, so that the semiconductor device 100 comprising a less bias-dependent capacitative element can be provided by a convenient process.

In other words, by employing an existing metal interconnection layer as an electrode in a capacitative element, a less bias-dependent capacitative element can be provided while avoiding increase in the number of manufacturing steps.

According to this process, the dielectrics 102a, 102b, 102c and 102d covering the inner surfaces of the concaves in the lower interconnection 101 are formed for a capacitative element. Thus, in comparison with a capacitative element having a planar structure, an area of the dielectrics 102a, 102b, 102c and 102d between the electrodes can be increased, so that a semiconductor device 100 comprising a capacitative element with a capacity per a unit area can be manufactured by a convenient process. Furthermore, by forming a capacitative element between metal interconnection layers, increase in the area of the semiconductor chip in the semiconductor device can be limited.

Furthermore, according to this process, the inner surface of a concave in the upper surface of the lower interconnection 101 can be conveniently oxidized or nitrided using oxygen or nitrogen plasma, to readily give a highly insulative capacitor film with a higher dielectric constant such as a Al or Cu oxide film, a nitride film or an oxide film. Thus, a semiconductor device 100 comprising a reliable capacitative element with a large capacity per a unit area can be consistently provided.

Embodiment 3

FIGS. 11 to 17 are process sectional views showing a process for manufacturing a semiconductor device comprising a capacitative element according to this embodiment. Although the dielectrics have been formed by oxidizing or nitriding the lower metal interconnection itself in Embodiments 1 and 2, they are formed in a concave by CVD or PVD in this embodiment.

Figure 11:
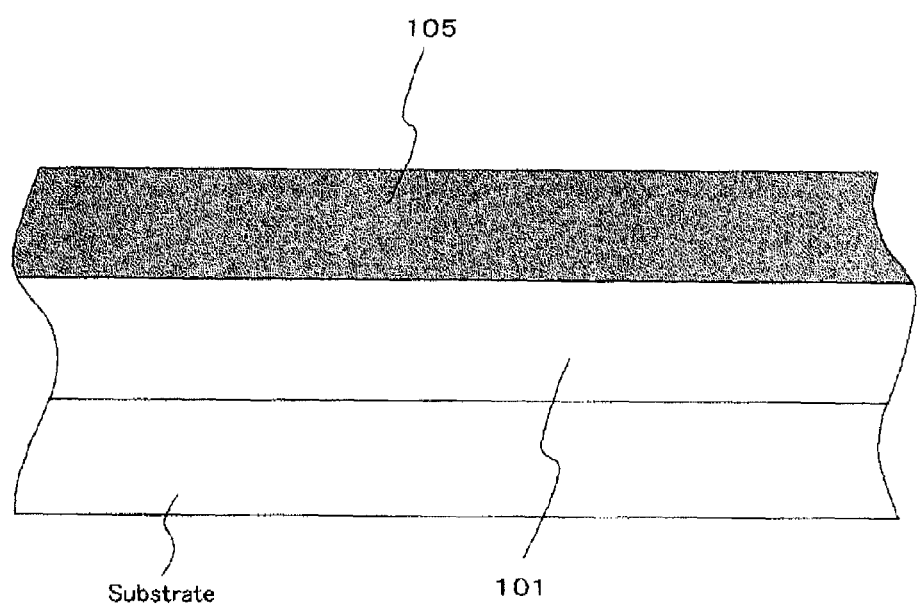
FIG. 11 is a process sectional view showing a process for manufacturing a semiconductor device comprising a capacitative element according to an embodiment.

For manufacturing a semiconductor device according to this embodiment, an interlayer insulating film 105 made of, for example, SiO2 is formed on a lower interconnection 101 made of a metal such as aluminum and copper, as shown in FIG. 11. The steps before forming the interlayer insulating film 105 are as in a common semiconductor device.

Figure 12:
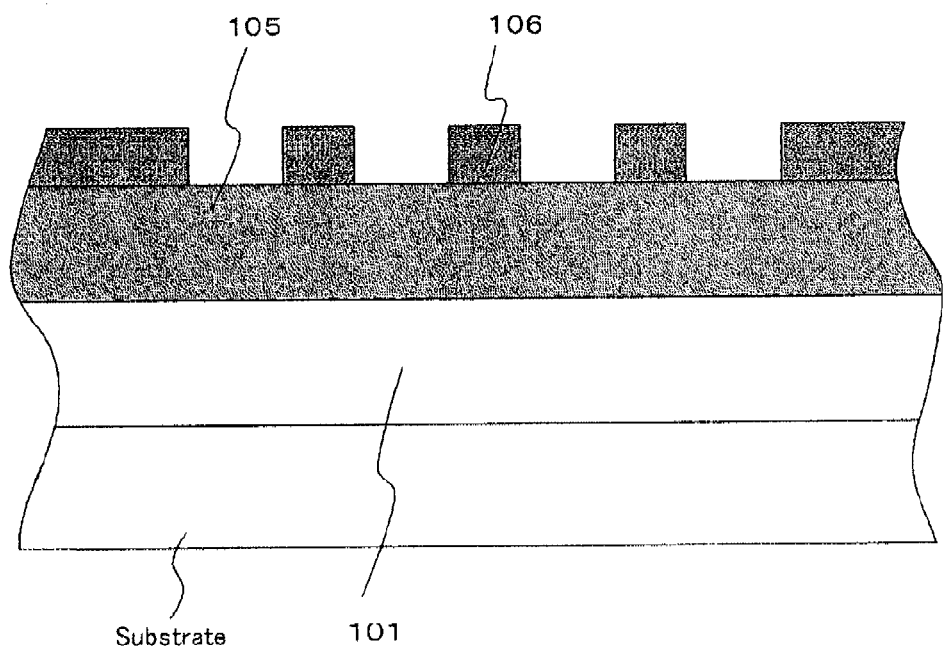
FIG. 12 is a process sectional view showing a process for manufacturing a semiconductor device comprising a capacitative element according to an embodiment.

Then, after forming the interlayer insulating film 105, a resist pattern of a resist film 106 is formed on the interlayer insulating film 105 for forming a metal plug hole for a capacitative element of this embodiment, as shown in FIG. 12.

Figure 13:
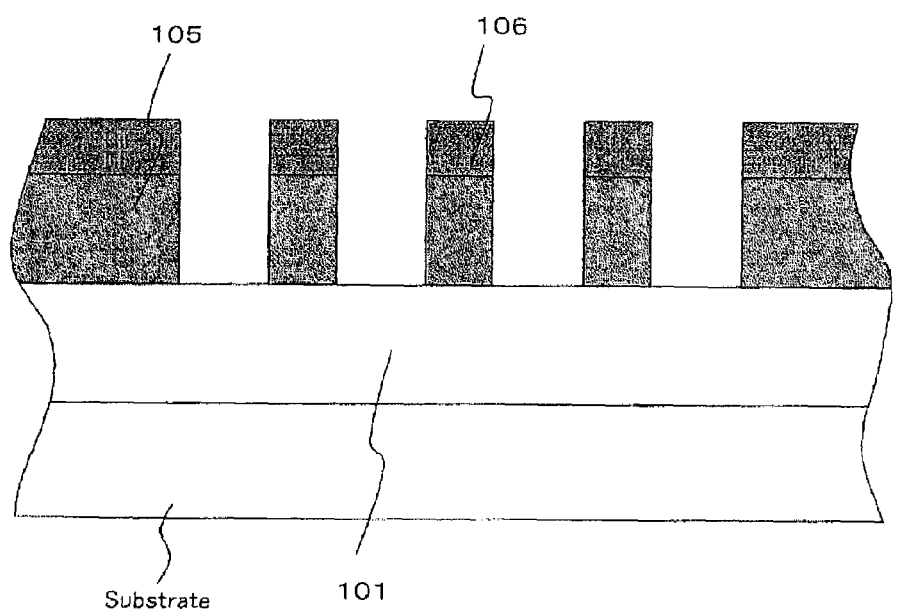
FIG. 13 is a process sectional view showing a process for manufacturing a semiconductor device comprising a capacitative element according to an embodiment.

Then, as shown in FIG. 13, the interlayer insulating film 105 is etched using the resist pattern of the resist film 106 as a mask. During the step, an etching gas may be an etching gas generally used in a via forming step in a common process for manufacturing a semiconductor device.

Figure 14:
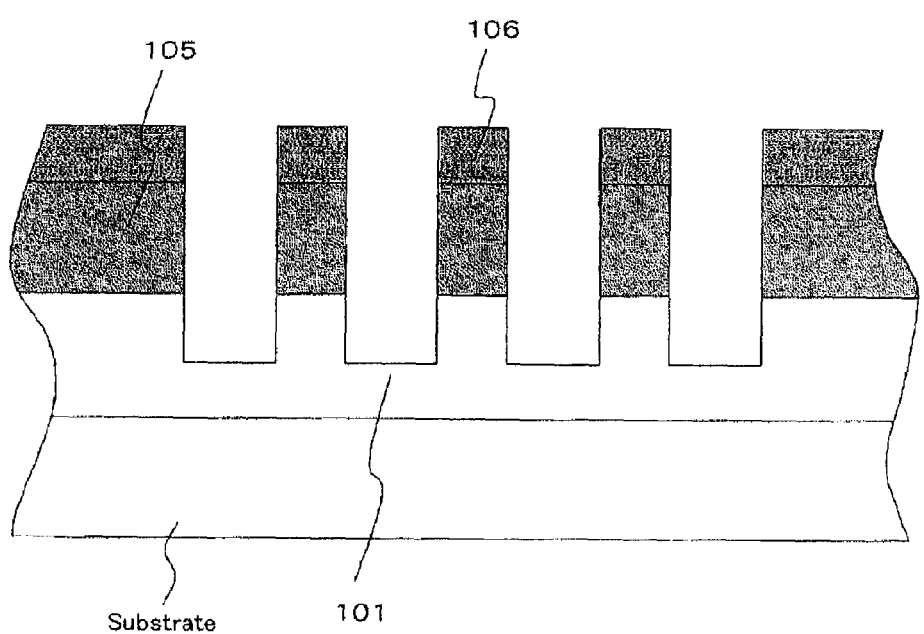
FIG. 14 is a process sectional view showing a process for manufacturing a semiconductor device comprising a capacitative element according to an embodiment.

Next, as shown in FIG. 14, a lower interconnection 101, a metal interconnection, is etched to form a concave pattern in the metal interconnection. During the step, a halogen-containing etching gas may be used when the lower interconnection 101 is made of aluminum.

Figure 15:
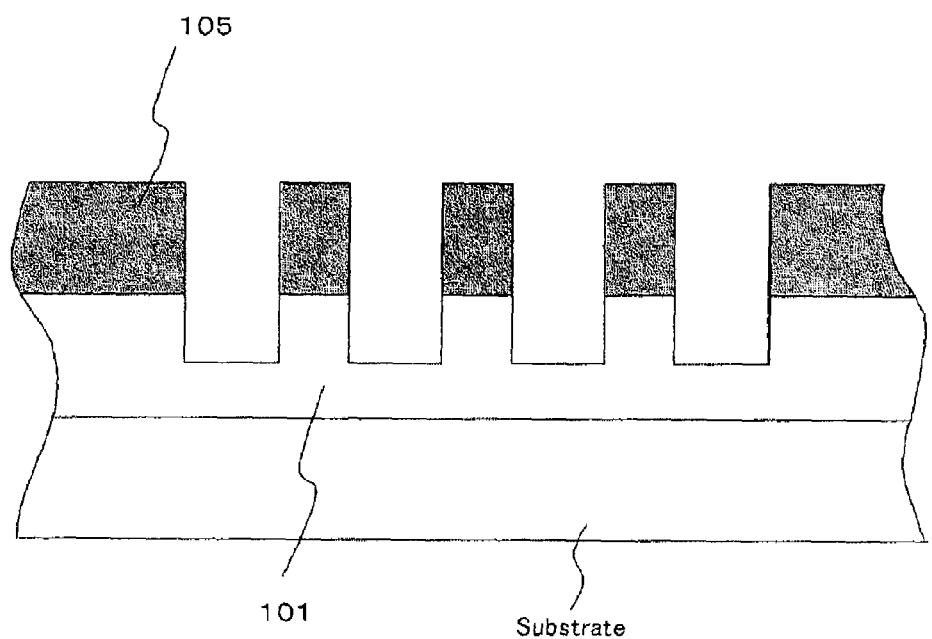
FIG. 15 is a process sectional view showing a process for manufacturing a semiconductor device comprising a capacitative element according to an embodiment.

Then, as shown in FIG. 15, the resist film 120 is removed as usual.

Figure 16:
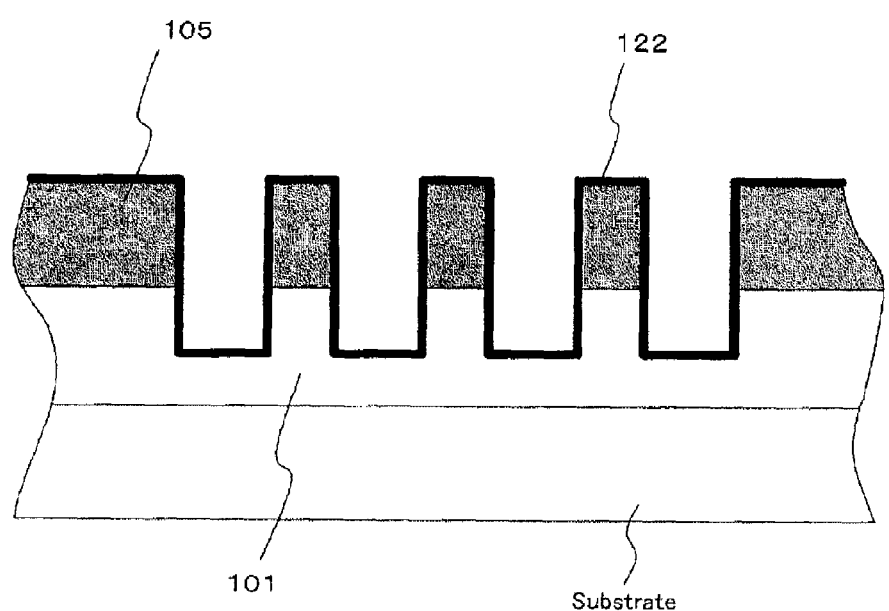
FIG. 16 is a process sectional view showing a process for manufacturing a semiconductor device comprising a capacitative element according to an embodiment.

Then, as shown in FIG. 16, a dielectric 122 is formed on the inner surface in the upper surface of the lower interconnection 101 and over the whole surface of the interlayer insulating film 105 by CVD or PVD. The dielectric 122 may be made of any material which allows the dielectric to be formed by CVD or PVD; for example, silicon oxide and silicon nitride.

The term "CVD" is an abbreviation of Chemical Vapor Deposition, which is one of film forming methods used in a manufacturing process for a semiconductor device. Specifically, it is used for forming a silicon oxide film, a silicon nitride film and a silicon oxynitride film. In CVD, a gas containing a starting material is energized by heating or light irradiation or converted into a plasma by radio-frequency radiation. Thus, the starting material becomes highly reactive by the radicalization and is adsorbed and deposited on a target.

In "thermal CVD", deposition is initiated by heating; in "photo CVD", light irradiation is used for accelerating a chemical reaction or thermal decomposition; and in "plasma CVD", a gas is excited into a plasma state. Any CVD process may be applied to this embodiment.

The term "PVD" is an abbreviation of Physical Vapor Deposition, which is one of film forming methods used in a manufacturing process for a semiconductor device. Specifically, high energy atoms (argon or its ions) are bombarded to a disc made of a material such as silicon oxide and silicon nitride under high vacuum for blowing away atoms or molecules in the disc like billiards, which are then deposited as a layer on a target.

Then, following a manufacturing step for a usual metal plug in a common semiconductor device, metal plugs 103a, 103b, 103c and 103d are formed. When the metal plugs 103a, 103b, 103c and 103d are made of aluminum or copper, they can be formed by CVD, a plasma process or plating.

Following a manufacturing step for a usual metal interconnection in a common semiconductor device, an upper interconnection 104 is formed. When the upper interconnection 104 is an aluminum or copper plug, it can be formed by CVD, a plasma process or plating.

Figure 17:
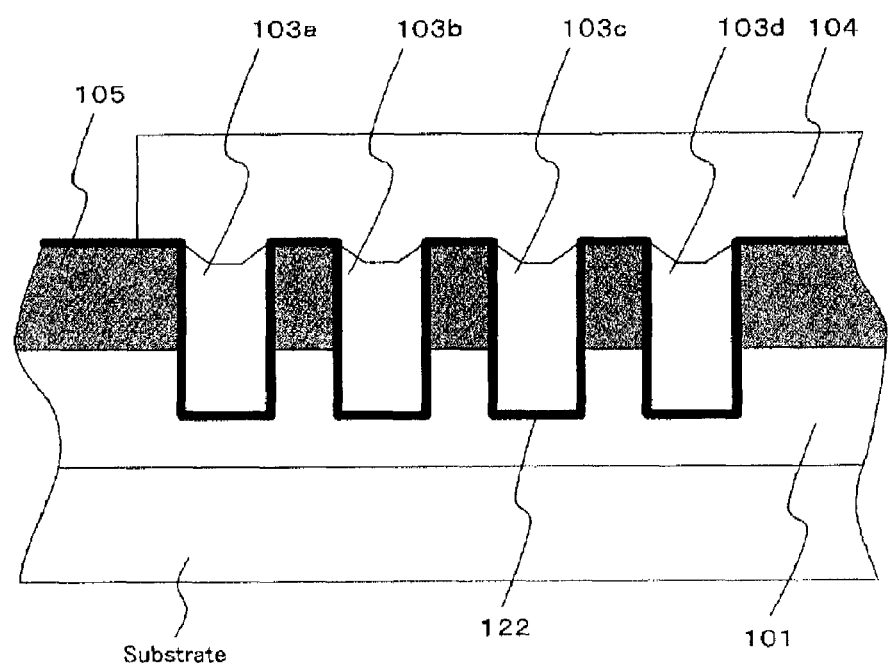
FIG. 17 is a process sectional view showing a process for manufacturing a semiconductor device comprising a capacitative element according to an embodiment.
Figure 18A:
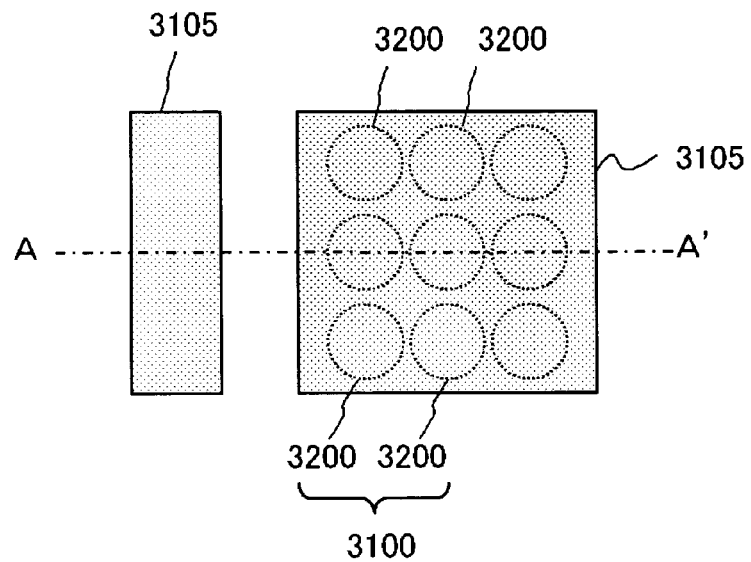
FIGS. 18A and 18B are a plan view and a cross-sectional view schematically showing an example of a semiconductor device comprising a capacitative element according to the prior art.
Figure 18B:
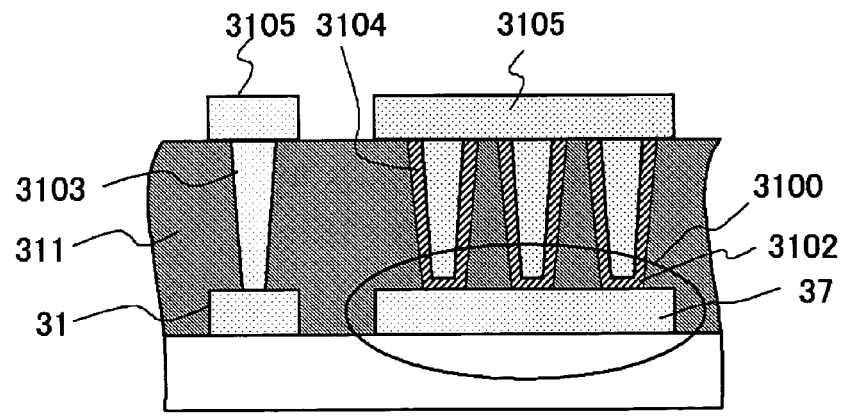
Figure 19:
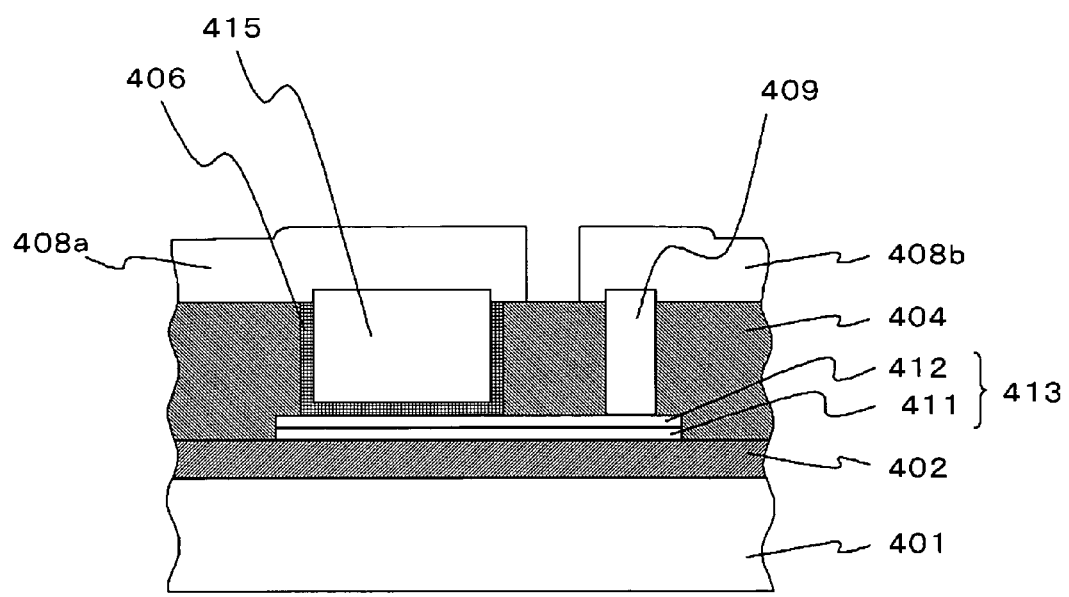
FIG. 19 is a cross-sectional view schematically showing an example of a semiconductor device comprising a capacitative element according to the prior art.

The above process can provide the semiconductor device according to this embodiment shown in FIG. 17.

The semiconductor device of this embodiment is less bias-dependent because it employs the structure consisting of the lower interconnection 101 and the metal plugs 103a, 103b, 103c, 103d as electrodes for a capacitative element.

In the semiconductor device of this embodiment, the dielectric 102a, 102b, 102c, 102d covering the inner surface of the concaves in the lower interconnection 101 is formed as a capacitor film for a capacitative element. Thus, in comparison with a capacitative element having a planar structure, the dielectrics 102a, 102b, 102c, 102d as a capacitor film have a larger area. The semiconductor device 100, therefore, has a capacitative element with a large capacity per a unit area.

In the semiconductor device of this embodiment, the lower interconnection 101 which is a usual metal interconnection in a common semiconductor device is used as one electrode in a capacitative element, while the metal plugs 103a, 103b, 103c, 103d which are usually used in a common semiconductor device are used as the other electrode in the capacitative element. Therefore, a capacitative element can be conveniently manufactured by a process for manufacturing a common semiconductor device and a production cost for a semiconductor device 100 comprising a capacitative element can be reduced.

In the semiconductor device of this embodiment, a material for the dielectric 122 may be relatively freely selected, so that a capacity per a unit area may be higher than a semiconductor device according to Embodiment 1 or 2, depending on a material used for the dielectric 122.

In the semiconductor device of this embodiment, when forming the dielectric 122 by nondirectional CVD or PVD, the dielectric 122 is thinner on the bottom of the metal plug hole while being thicker on the interlayer insulating film 105. Thus, the dielectric 122 can be thinner in a region functioning as a capacitor film in a capacitative element, resulting in a larger capacity per a unit area.

In the semiconductor device of this embodiment, the dielectric 122 remains under the upper interconnection 104, but it rather has an advantage of improved insulation because the dielectric 122 is made of an insulative material.

The dielectrics 102a, 102b, 102c, 102d may be films made of any appropriate insulating material with a high dielectric constant which allows CVD or PVD to be used for forming the dielectrics; for example, a silicon oxide film, a silicon nitride film or a silicon oxynitride film. These dielectrics can be formed by CVD or PVD; are highly insulative; and function as a capacitor film with a higher dielectric constant, to provide a semiconductor device comprising a reliable capacitative element with a large capacity per a unit area.

A film thickness of the dielectric 102a, 102b, 102c or 102d is about 10 nm to 100 nm. A depth of the concave in the upper surface of the lower interconnection 101 where the dielectrics 102a, 102b, 102c, 102d are formed is about 5 nm to 990 nm.

The embodiments of this invention have been described with reference to the drawings, but these are only illustrative and a variety of configurations other than those described above may be employed.

For example, although the metal plugs 103a, 103b, 103c, 103d are connected to the single upper interconnection 104 in the above embodiments, they may be connected to a plurality of different upper interconnections 104. It may have an advantage that it allows a capacitative element connected the plurality of upper interconnections 104 to be formed, resulting in a stabilized current in all of the plurality of upper interconnections 104.

Although aluminum or copper is used as a material for an interconnection in the above embodiments, there may be formed a film containing another metal in the surrounding area of the copper or aluminum interconnection. For example, a barrier metal film containing such as TiN may be formed in the surrounding area of the copper interconnection for preventing copper atoms from diffusing in the interlayer insulating film 105.

It is apparent that the present invention is not limited to the above embodiment, that may be modified and changed without departing from the scope and spirit of the invention.

What is claimed is:

1. A semiconductor device, comprising:
   a semiconductor substrate;
   a first metal film on the semiconductor substrate;
   an insulating film disposed on the first metal film, wherein the insulating film includes a through hole whose tip is a concave in the upper surface of the first metal film;
   a capacitor film covering the inner surface of the concave; and
   a second metal film on the capacitor film.

2. The semiconductor device according to claim 1, wherein the first metal film is a metal interconnection; and the second metal film is a metal plug.

3. The semiconductor device according to claim 1, wherein a plurality of the concaves are formed in the first metal film; and
   a second metal film is formed on each of the capacitor films covering the inside of the plurality of concaves.

4. The semiconductor device according to claim 3, further comprising a third metal film connected to each of the plurality of second metal films.

5. The semiconductor device according to claim 3, wherein the third metal film is a metal interconnection.

6. The semiconductor device according to claim 1, wherein the capacitor film comprises a metal oxide film, a metal nitride film or a metal oxynitride film.

7. The semiconductor device according to claim 6, wherein the capacitor film comprises a film formed by oxidizing or nitriding the inner surface of the concave in the first metal film.

8. The semiconductor device according to claim 1, wherein the first metal film comprises an Al- or Cu-containing metal film; and
the capacitor film comprises an Al oxide or Cu oxide, nitride or oxynitride film.

9. The semiconductor device according to claim 1, wherein the capacitor film comprises a silicon oxide film, a silicon nitride film or a silicon oxynitride film.

10. The semiconductor device according to claim 1, wherein the capacitor film comprises a film deposited on the inner surface of the first metal film by CVD or PVD.

11. The semiconductor device according to claim 1, wherein the first metal film
and the insulating film are on separate layers of the semiconductor device with respect to a direction in which the insulator film is disposed on the first metal film.

12. A process for manufacturing a semiconductor device, comprising:
forming a first metal film on the upper surface of a semiconductor substrate;
forming an upper insulating film on the first metal film;
forming a through hole penetrating the insulating film, whose tip is a concave in the upper surface of the first metal film;
forming a capacitor film covering the inner surface of the concave in the first metal film; and
forming a second metal film on the capacitor film.

13. The process for manufacturing a semiconductor device according to claim 12, further comprising the step of forming a third metal film connected to the second metal film on the insulating film and the second metal film.

14. The process for manufacturing a semiconductor device according to claim 11, wherein the step of forming the capacitor film comprises oxidizing or nitriding the inner surface of the concave in the first metal film.

15. The process for manufacturing a semiconductor device according to claim 12, wherein the step of forming the capacitor film comprises forming the capacitor film on the inner surface of the concave in the first metal film by CVD or PVD.

16. A capacitor comprising:
a first metal wiring;
an interlayer insulating film disposed on said first metal wiring, the interlayer insulating film having a plurality of holes therethrough, wherein the plurality of the holes extend into an upper surface of the first metal wiring defining a plurality of concaves in the upper surface of the first metal wiring;
a plurality of dielectric films each disposed on the upper surface of said first metal wiring in each of the plurality of the concaves;
a plurality of plugs each formed in the corresponding ones of said plurality of the concaves and said plurality of the holes;
and a second metal wiring formed on said interlayer insulating film and said plurality of the plugs;
and a second metal wiring formed on said interlayer and said plurality of plugs.

* * * * *